(12) United States Patent
Zhang (10) Patent No.: US 9,064,840 B2
(45) Date of Patent: *Jun. 23, 2015

(54) INSULATED GATE BIPOLAR TRANSISTORS INCLUDING CURRENT SUPPRESSING LAYERS

(71) Applicant: Cree, Inc., Durham, NC (US)

(72) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,931

(22) Filed: Aug. 22, 2014

(65) Prior Publication Data

US 2014/0363931 A1 Dec. 11, 2014

Related U.S. Application Data

(63) Continuation of application No. 11/711,383, filed on Feb. 27, 2007, now Pat. No. 8,835,987.

(51) Int. Cl.
*H01L 21/332* (2006.01)
*H01L 29/36* (2006.01)
(Continued)

(52) U.S. Cl.
CPC ............ *H01L 29/36* (2013.01); *H01L 29/7393* (2013.01); *H01L 29/66068* (2013.01); *H01L 29/0834* (2013.01); *H01L 29/0847* (2013.01); *H01L 29/1608* (2013.01); *H01L 29/7395* (2013.01); *H01L 29/66333* (2013.01)

(58) Field of Classification Search
CPC ............ H01L 29/7393; H01L 29/7395; H01L 29/66068

USPC .......................................................... 438/135
See application file for complete search history.

(56) References Cited

U.S. PATENT DOCUMENTS 3,439,189 A 4/1969 Petry
3,629,011 A 12/1971 Tohi et al.
(Continued)

FOREIGN PATENT DOCUMENTS

DE 39 42 640 A1 8/1990
DE 198 09 554 9/1998
(Continued)

OTHER PUBLICATIONS

Summons to Attend Oral Proceedings, corresponding to EP 07120038.0, mailing date Dec. 15, 2014 (4 pages).
(Continued)

*Primary Examiner* — Jamie C Niesz
(74) *Attorney, Agent, or Firm* — Myers Bigel Sibley & Sajovec, P.A.

(57) ABSTRACT

An insulated gate bipolar transistor (IGBT) includes a first conductivity type substrate and a second conductivity type drift layer on the substrate. The second conductivity type is opposite the first conductivity type. The IGBT further includes a current suppressing layer on the drift layer. The current suppressing layer has the second conductivity type and has a doping concentration that is larger than a doping concentration of the drift layer. A first conductivity type well region is in the current suppressing layer. The well region has a junction depth that is less than a thickness of the current suppressing layer, and the current suppressing layer extends laterally beneath the well region. A second conductivity type emitter region is in the well region.

16 Claims, 3 Drawing Sheets

(51) Int. Cl.
*H01L 29/739* (2006.01)
*H01L 29/66* (2006.01)
*H01L 29/08* (2006.01)
*H01L 29/16* (2006.01)

(56) References Cited

U.S. PATENT DOCUMENTS

| | | |
|---|---|---|
| 3,758,831 A | 9/1973 | Clark |
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,500,902 A | 2/1985 | Herberg |
| 4,581,542 A | 4/1986 | Steigerwald |
| 4,644,637 A | 2/1987 | Temple |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,124,772 A * | 6/1992 | Hideshima et al. ............ 257/110 |
| 5,141,889 A | 8/1992 | Terry et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,291,050 A | 3/1994 | Nishimura |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,608,237 A | 3/1997 | Aizawa et al. |
| 5,623,151 A | 4/1997 | Ajit |
| 5,629,531 A | 5/1997 | Palmour |
| 5,631,483 A | 5/1997 | Ferla et al. |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,169,300 B1 | 1/2001 | Fragapanet |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,242,967 B1 | 6/2001 | Iwamuro et al. |
| 6,246,076 B1 | 6/2001 | Lipkin et al. |
| 6,268,769 B1 | 7/2001 | Yamauchi et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,570,185 B1 | 5/2003 | Tan |
| 6,573,534 B1 | 6/2003 | Kumar et al. |
| 6,593,620 B1 | 7/2003 | Hshieh et al. |
| 6,600,192 B1 | 7/2003 | Sugawara et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |

(56) References Cited

U.S. PATENT DOCUMENTS

| | | | |
|---|---|---|---|
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,091,578 B2 | 8/2006 | Park |
| 7,118,970 B2 | 10/2006 | Das et al. |
| 7,125,786 B2 | 10/2006 | Ring et al. |
| 7,221,010 B2 | 5/2007 | Ryu |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 8,835,987 B2 * | 9/2014 | Zhang ........................... 257/197 |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0079989 A1 | 4/2004 | Kaneko et al. |
| 2004/0082116 A1 | 4/2004 | Kub et al. |
| 2004/0119076 A1 * | 6/2004 | Ryu ................. 257/77 |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0245034 A1 | 11/2005 | Fukuda et al. |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0086997 A1 | 4/2006 | Kanaya et al. |
| 2006/0102908 A1 | 5/2006 | Imai et al. |
| 2006/0118818 A1 | 6/2006 | Shimoida et al. |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0066039 A1 | 3/2007 | Agarwal et al. |
| 2007/0120148 A1 | 5/2007 | Nogome |
| 2007/0164321 A1 | 7/2007 | Sheppard |
| 2007/0241427 A1 | 10/2007 | Mochizuki et al. |
| 2008/0001158 A1 * | 1/2008 | Das et al. ........................... 257/77 |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0157117 A1 | 7/2008 | McNutt et al. |
| 2008/0191304 A1 | 8/2008 | Zhang et al. |
| 2008/0230787 A1 | 9/2008 | Suzuki et al. |
| 2008/0251793 A1 | 10/2008 | Mazzola |
| 2008/0277669 A1 | 11/2008 | Okuno et al. |
| 2008/0296771 A1 | 12/2008 | Das et al. |
| 2009/0085064 A1 | 4/2009 | Rueb et al. |
| 2009/0121319 A1 | 5/2009 | Zhang et al. |
| 2009/0212301 A1 | 8/2009 | Zhang et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0244047 A1 | 9/2010 | Hull et al. |

FOREIGN PATENT DOCUMENTS

| | | |
|---|---|---|
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0 615 292 A1 | 3/1994 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693 896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | H03-016257 A | 1/1991 |
| JP | 03-034466 | 2/1991 |
| JP | 3 034466 A | 2/1991 |
| JP | 03034466 | 2/1991 |
| JP | 03157974 | 7/1991 |
| JP | 3-225870 | 10/1991 |
| JP | H03-259614 A | 11/1991 |
| JP | 05-029628 | 2/1993 |
| JP | 5 029629 A | 2/1993 |
| JP | H06-061496 A | 3/1994 |
| JP | 2006-511961 A | 4/1996 |
| JP | 08264766 | 10/1996 |
| JP | 9 129874 A | 5/1997 |
| JP | 09205202 | 8/1997 |
| JP | 9 326486 A | 12/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2000106371 A | 4/2001 |
| JP | 2002-514355 A | 5/2002 |
| JP | 2002-314099 | 10/2002 |
| JP | 2005-167035 A | 6/2005 |
| JP | 2006-344779 A | 12/2006 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO 98/57378 | 12/1998 |
| WO | WO 99/46809 | 9/1999 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |

(56) References Cited

FOREIGN PATENT DOCUMENTS

| WO | WO 2005/020308 A1 | 3/2005 |
|---|---|---|
| WO | WO 2006/135031 A2 | 12/2006 |
| WO | WO 2007/040710 A1 | 4/2007 |

OTHER PUBLICATIONS

"Insulated-gate bipolar transistor." *Wikipedia, the Free Encyclopedia*. Web. Jun. 21, 2010. http://en.wikipedia.org.

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," 1996 *IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS Publishing Company, Boston, MA. 426-502 (1996).

Baliga "Power MOSFET" *Power Semiconductor Devices*. PWS Publishing Company, Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294, 1989.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2$/SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al. "Theoretical Analysis of Current Crowding Effect in Metal/AlGaN/GaN Schottky Diodes and Its Reduction by Using Polysilicon in Anode,"Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on $SiO_2$/SiC Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/30715, May 6, 2002.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Fukuda et al. "Improvement of $SiO_2$/4H-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

(56) References Cited

OTHER PUBLICATIONS

International Search Report and Written Opinion (13 pages) corresponding to International Application No. PCT/US2008/010538; Mailing Date: Dec. 22, 2008.
International Search Report and Written Opinion (14 pages) corresponding to International Application No. PCT/US2010/020071; Mailing Date: Mar. 26, 2010.
International Search Report and Written Opinion (14 pages) corresponding to International Application No. PCT/US2009/065251; Mailing Date: Jun. 1, 2010.
International Search Report and Written Opinion (16 pages) corresponding to International Application No. PCT/US2009/003089; Mailing Date: Aug. 20, 2009.
International Search Report and Written Opinion for PCT/US2007/014139; Feb. 4, 2008.
International Search Report and Written Opinion for PCT/US2010/025053 mailed on Jul. 2, 2010.
International Search Report and Written Opinion, International Application No. PCT/US2009/000734, Apr. 23, 2009.
International Search Report, PCT/US2008/008574, Sep. 26, 2008.
Invitation to Pay Additional Fees for PCT/US2007/010192; Oct. 29, 2007.
Invitation to Pay Additional Fees for PCT/US2010/025053 mailed on May 3, 2010.
J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.
J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.
J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.
Jamet, et al. "Physical properties of $N_2O$ and NO-nitrided gate oxides grown on 4H SiC," *Applied Physics Letters*. vol. 79, No. 3, Jul. 16, 2001, pp. 323-325.
K. Ueno and Tadaaki Oikawa, "Counter-Doped MOSFET's of 4H-SiC," *IEEE Electron Device Letters*, vol. 20, No. 12, pp. 624-626, Dec. 1999.
K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.
Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.
Kinoshita et al., "Guard Ring Assisted RESURF: A New Termination Structure Providing Stable and High Breakdown Voltage for SiC Power Devices,"Tech. Digest of ISPSD '02, pp. 253-256, 2002.
Kobayashi et al. "Dielectric Breakdown and Current Conduction of Oxide/Nitride/Oxide Multi-Layer Structures," 1990 *IEEE Symposium on VLSI Technology*. pp. 119-120.
Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.
L.A. Lipkin and J.W. Palmour, "Low interface state density oxides on p-type SiC," Materials Science Forum vols. 264-268, pp. 853-856, 1998.
Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.
Leonhard et al. "Long term stability of gate-oxides on n- and p-type silicon carbide studied by charge injection techniques," *Materials Science Engineering*, vol. 46, No. 1-3, Apr. 1997, pp. 263-266.
Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.
Lipkin et al. "Challenges and State-of-the-Art Oxides in SiC," *Mat. Res. Soc. Symp. Proc.* vol. 640, 2001, pp. 27-29.
Losee et al., "Degraded Blocking Performance of 4H-SiC Rectifiers Under High dV/dt Conditions", Proceedings of $17^{th}$ International Symposium on Power Semiconductor Devices & IC's, 4 pages (May 23-26, 2005). XP010820730.
Losee et al., "High-Voltage 4H-SiC PiN Rectifiers with Single-Implant, Multi-Zone JTE Termination", Power Semiconductor Devices and ICs, 2004 Proceedings. ISPSB '04. The $16^{th}$ International Symposium on Kitakyushu Int. Conf. Center, Japan May 24-27, 2004, Piscataway, NJ, USA, IEEE, May 24, 2004, pp. 301-304, XP010723398.
M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.
M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.
M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.
M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.
Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.
Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.
Motorola Power MOSFET Transistor Databook, 4th edition. Motorola, INc., 1989, pp. 2-5-4-2-5-7.
Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.
Myer-Ward et al. "Turning of Basal Plane Dislocations During Epitaxial Growth on 4 off-axis 4h-SiC" $7^{th}$ *European Conference on Silicon Carbide and Related Materials*, Barcelona-Spain, Sep. 7-11, 2008 retrieved from http://ecscrm08.com/invited_presentations.html, retrieved Jul. 1, 2009.
Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.
Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.
Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.
Notification of Transmittal of the International Search Report and the Written Opinion of the International Searching Authority, or the Declaration, PCT/US2010/028612, Jun. 17, 2010.
Notification of Transmittal of the International Search Report and the Written Opinion of the International Searching Authority, or the Declaration; International Search Report; Written Opinion of the International Searching Authority, PCT/US2008/004239, Mar. 2, 2009.

(56) References Cited

OTHER PUBLICATIONS

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al., "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N. sup.+ P 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 $m\Omega$-$cm^2$, 1.6 kV Power DiMOSFETs in 4H-SiC," *Proceedings of the 14 International Symposium on Power Semiconductor Devices & ICs* 2002, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*; vol. 17, No. 3, pp. 136-138, Mar. 1996.

S.M. Sze Semiconductor Devices, Physics and Technology. $2^{nd}$ Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2; Nov. 2001; pp. L1201-L1203.

Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol.* (a), vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing,"Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2O$-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Y. Wang, C. Weitzel, and M. Bhatnagar, "Accumulation-Mode SiC Power MOSFET Design Issues," *Materials Science Forum*, vols. 338-342, pp. 1287-1290, 2000.

Yilmaz, "Optimization and Surface Charge Sensitivity of High Voltage Blocking Structures with Shallow Junctions,"IEEE Transactions on Electron Devices, vol. 38, No. 3, Jul. 1991, pp. 1666-1675.

Zhang et al., "A 10-kV Monolithic Darlington Transistor with βforced of 336 in 4H-SiC," IEEE Electron Device Letters, vol. 30, No. 2, pp. 142-144, XP011240662, Feb. 1, 2009.

(56) References Cited

OTHER PUBLICATIONS

Zhang et al.; *Design and Fabrications of High Voltage IGBTs on 4H-SiC*; 2006 IEEE Proceedings of the 18$^{th}$ International Symposium on Power Semiconductor Devices & ICs, Napels, Italy Jun. 4-8, 2006, pp. 1-4.
Second Examination Report, Corresponding to European Patent Application No. 07120038.0, dated Apr. 15, 2013, 5 pages.
International Search Report and Written Opinion of the International Searching Authority corresponding to International Application No. PCT/US2010/035709; Date of mailing: Apr. 7, 2011; 12 pages.
International Preliminary Report on Patentability Corresponding to PCT/US2010/035709; Date of Mailing: Dec. 15, 2011; 8 pages.
International Preliminary Report on Patentability Corresponding to PCT/US2010/035713; Date of Mailing: Dec. 15, 2011; 8 pages.
International Search Report and The Written Opinion of The International Searching Authority Corresponding to International Application No. PCT/US2010/034502; Date of Mailing: Jul. 13, 2011; 17 pages.
Invitation to Pay Additional Fees and, Where Applicable, Protest Fee Corresponding to International Application No. PCT/US2010/034502; Date of Mailing: May 24, 2011; 8 Pages.
J. T. Richmond, S. Ryu, A.K. Agarwal and J.W. Palmour, "Hybrid 4H-SiC MOS Gated Transistor (MGT)", (admitted prior art).
M. Das et al., "A 13 kV 4H-SiC N-Channel IGBT with Low Rdiff,on and Fast Switching" presented at: International Conference on Silicon Carbide and Related Materials (ICSCRM), Otsu, Japan, Oct. 14-19, 2007.
Ryu et al. "10 kV, 123 mΩ-cm<2>4H-SiC Power DMOSFETs" *Device Research Conference*, 2004. 62$^{nd}$ *DRC, Conference Digest*, Jun. 21-23, 2004, Piscataway, NJ, USA, IEEE, Jun. 21, 2004, pp. 47-48. XP010748127.
Tang et al. "High-Voltage Implanted-Emitter 4H-SiC BJTS" *IEEE Electron Device Letters*, IEEE Service Center, New York, NY. vol. 23 No. 1. Jan. 1, 2002. XP001112376.
Tang et al. "Hybrid All-Sic MOS-Gated Bipolar Transistor (MGT)" *Proceedings of the 14$^{th}$ International Symposium on Power Semiconductor Devices & ICS. ISPSD'02.* Santa Fe, NM Jun. 4-7, 2002; International Symposium on Power Semiconductor Devices & IC's, New York, NY: IEEE, Jun. 4, 2002, pp. 53-56. XP010591564.
Yi Tang, Sujit Banerjee and T. Paul Chow, Hybrid All-siC MOS-Gated Bipolar Transistor (MGT), Proceedings of the 14$^{th}$ International Symposium on Power Semiconductor Devices and ICs, 2002.
Zhang et al. "A 10-kV Monolithic Darlington Transistor With β forced of 336 in 4H-SiC" *IEEE Electron Device Letters*, vol. 30, No. 2, pp. 142-144, Feb. 1, 2009, New York, NY. XP011240662.
International Preliminary Report on Patentability Corresponding to International Application No. PCT/US2011/027383; Date of Mailing: Sep. 20, 2012; 7 pages.
Japanese Office Action Corresponding to Japanese Patent Application No. 2012-513973; Dispatched Date: Aug. 14, 2013; Foreign Text, 4 Pages, English Translation Thereof, 4 Pages.
Japanese Office Action Corresponding to Japanese Patent Application No. 2012-513972; Dispatch Date: Aug. 14, 2013; Foreign Text, 3 Pages, English Translation Thereof, 3 Pages.
Japanese Office Action Corresponding to Japanese Patent Application No. 2012520635; Dispatch Date: Sep. 9, 2013; Foreign Text, 4 Pages, English Translation Thereof, 3 Pages.

\* cited by examiner

INSULATED GATE BIPOLAR TRANSISTORS INCLUDING CURRENT SUPPRESSING LAYERS

RELATED APPLICATIONS

This present application is a continuation of U.S. patent application Ser. No. 11/711,383 (now U.S. Pat. No. 8,835,987), filed Feb. 27, 2007, in the United States Patent and Trademark Office, the disclosure of which is hereby incorporated herein in its entirety by reference.

STATEMENT OF U.S. GOVERNMENT INTEREST

This invention was made with Government support under Contract No. N00014-05-C-0202 awarded by ONR/DARPA. The Government has certain rights in the invention.

FIELD OF THE INVENTION

The present invention relates to electronic devices and fabrication methods. More particularly, the present invention relates to high power insulated gate bipolar transistors and fabrication methods.

BACKGROUND

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications.

SiC DMOSFET devices with a 10 kV blocking capability have been fabricated with a specific on-resistance of about 100 mΩ×cm². DMOSFET devices may exhibit very fast switching speed of for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4H—SiC PiN Diodes", Journal of Electrical Materials, Vol. 34, No. 4, 2005. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4H—SiC insulated gate bipolar transistors (IGBTs) are becoming more suitable for power switching applications.

Silicon carbide (SiC) IGBT devices are considered to be appropriate devices for high power applications, especially for devices with blocking voltages in excess of 10 kV. The forward voltage drop of an IGBT is an important parameter of the device that affects the total power loss of the device. Thus, to achieve low power loss, a low forward voltage drop is desired.

SUMMARY

Some embodiments of the invention provide an insulated gate bipolar transistor (IGBT). The IGBT includes a first conductivity type substrate and a second conductivity type drift layer on the substrate. The second conductivity type is opposite the first conductivity type. The IGBT further includes a current suppressing layer on the drift layer. The current suppressing layer has the second conductivity type and has a doping concentration that is larger than a doping concentration of the drift layer. A first conductivity type well region is in the current suppressing layer, and a second conductivity type emitter region is in the well region.

The IGBT may further include a gate oxide on the current suppressing layer above the well region, a gate on the gate oxide layer, and an emitter contact on the emitter region.

The current suppressing layer may include an epitaxial layer. In particular, the substrate may include an off-axis n-type silicon carbide substrate, and the drift layer and the current suppressing layer include p-type silicon carbide epitaxial layers.

The current suppressing layer may have a thickness of about 1 µm, and/or may have a doping concentration of about $1\times10^{15}$ cm$^{-3}$ to about $1\times10^{15}$ cm$^{-3}$. In some embodiments, the current suppressing layer may have a doping concentration of about $1\times10^{16}$ cm$^{-3}$.

The drift layer may have a doping concentration of about $2\times10^{14}$ cm$^{-3}$ to about $2\times10^{14}$ cm$^{-3}$ and a thickness of about 100 µm to about 120 µm.

The first conductivity may include n-type and the second conductivity may include p-type. In some embodiments, the first conductivity may include p-type and the second conductivity may include n-type.

The IGBT may further include a buffer layer between the substrate and the drift layer, the buffer layer may have the second conductivity type.

The well region may have a junction depth that is less than a thickness of the current suppressing layer. In particular, the well region may have a junction depth of about 0.5 µm.

Some embodiments of the invention provide methods of forming an IGBT. The methods include providing a substrate having a first conductivity type, and forming a drift layer on the substrate. The drift layer has a second conductivity type opposite the first conductivity type. The methods further include forming a current suppressing layer on the drift layer. The current suppressing layer has the second conductivity type and has a doping concentration that is larger than a doping concentration of the drift layer. A first conductivity type well region is formed in the current suppressing layer, and a second conductivity type emitter region is formed in the well region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Some embodiments of the invention provide silicon carbide (SiC) IGBTs that are suitable for high power and/or high temperature applications. Some embodiments of the invention provide high voltage planar IGBTs on 4H—SiC.

A planar gate 5.8 kV IGBT in SiC was built on an n-type substrate in 2005. See, Q. Zhang, C. Jonas, S. Ryu, A. Agarwal and J. Palmour "Design and Fabrications of High Voltage IGBTs on 4H—SiC", ISPSD Proceeding, 2006. The p− channel IGBT was selected due to the lack of high quality, low resistivity p-SiC substrates, which are required for n-channel IGBTs. The device exhibits a differential on-resistance (Rdiff, on) of about 570 mΩ×cm² at a gate bias of −30 V at 25° C., and decreases to about 118 mΩ×cm² at 200° C., respectively. The high on-resistance was primarily attributed to the low bulk carrier lifetimes, and low hole channel mobility.

Figure 1:
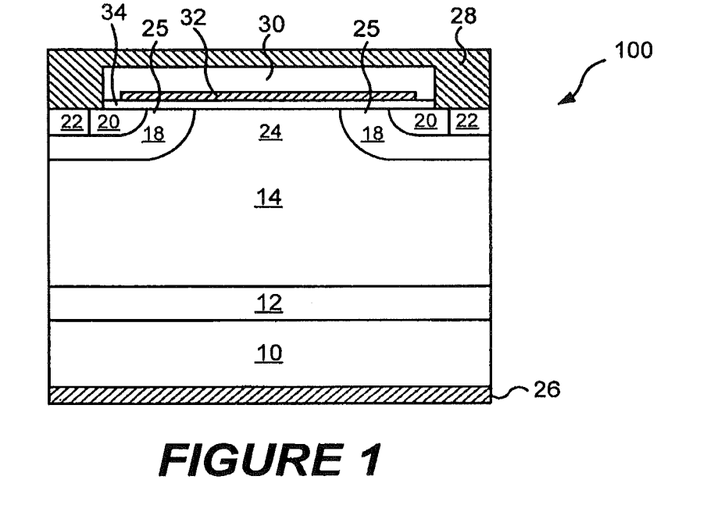
FIG. 1 is a cross-section of a conventional IGBT device.

A unit cell 100 of a planar IGBT structure is shown in FIG. 1. A planar device structure, such as the structure of the device 100 shown in FIG. 1, may provide process simplification and/or enhanced device reliability. However, other device structures may be advantageously employed.

The device 100 of FIG. 1 includes a p-type buffer layer 12 and a p– drift epitaxial layer 14 on an n-type, 8° off-axis 4H—SiC substrate 10. The p– drift layer 14 may have a thickness of about 100 μm to about 120 μm, and may be doped with p– type dopants at a doping concentration of about $2 \times 10^{14}$ cm$^{-3}$ to about $6 \times 10^{14}$ cm$^{-3}$ for a blocking capability of about 10 kV. The p-type buffer layer 12 may have a thickness of about 1 to about 2 μm and may be doped with p-type dopants at a doping concentration of about $1 \times 10^{17}$ cm$^{-3}$. The p-type buffer layer 12 may be provided as a channel stop layer to prevent punch-through.

The structure further includes n+ well regions 18 and p+ emitter regions 20 that may be formed by selective implantation of, for example, nitrogen and aluminum, respectively. The junction depth of the n+ well regions 18 may be about 0.5 μm. The structure 100 further includes n+ contact regions 22 that extend from a surface of the drift layer 14 into the n+ well regions 18. A guard-ring based termination (not shown) may be provided around the device periphery.

A JFET region 24 may be formed, for example, by implantation of aluminum, in the drift layer 14 between adjacent n+ well regions 18. The JFET region 24 may be implanted with p-type dopants to reduce the JFET resistance from the adjacent n+ well regions. In particular, the JFET implantation dose may be selected to reduce the JFET resistance while keeping implant damage at an acceptable level. In some embodiments, the JFET implantation may be performed at a dose sufficient to provide a dopant concentration of about $1 \times 10^{16}$ cm$^{-3}$ in the JFET region. The JFET region may, for example, be formed by an epitaxial growth process.

In some embodiments, a buried channel may be provided in the MOS channel region 15 of the device 100. In particular, a p-type dopant, such as aluminum, may be implanted into the channel region 25 of the n+ well regions 18 between the p+ emitter regions 20 and the JFET region 24 to modify the threshold voltage and/or to improve the inversion channel mobility. The buried channel layer may be formed using ion implantation and/or epitaxial regrowth techniques. For example, after an activation anneal of the n+ well regions 18 and JFET implants, a buried channel layer may be grown by epitaxial regrowth. In that case, the buried channel may also permit formation of a deep n-well that may prevent latch-up by lifting the p-type emitter implants to the buried channel regrowth layer. The deep n-well may cause a lower n-well resistance and may increase the device latch-up current.

The buried channel may be formed by ion implantation with a dose of from about $5 \times 10^{11}$ cm$^{-2}$ to about $5 \times 10^{13}$ cm$^{-2}$ depending on the amount of threshold adjustment required. In particular embodiments, a threshold adjustment implant of aluminum may be performed at a dose of $3 \times 10^{12}$ cm$^{-2}$. The implant energy may be selected to position the channel at the surface of the device or at a desired distance from the surface. In some embodiments, the threshold adjustment implant may be performed with an implant energy of at least about 25 keV. In some embodiments, the threshold adjustment may include multiple implants. In particular embodiments, the threshold adjustment may be accomplished by implanting aluminum ions with a dose of $8.4 \times 10^{11}$ cm$^{-2}$ at 45 keV, a dose of $1.12 \times 10^{12}$ cm$^{-2}$ at 85 keV, a dose of $1.52 \times 10^{12}$ cm$^{-2}$ at 140 keV, a dose of $1.92 \times 10^{12}$ cm$^{-2}$ at 210 keV, and a dose of $4.6 \times 10^{12}$ cm$^2$ at 330 keV, for a total aluminum dose of $1 \times 10^{13}$ cm$^{-2}$. The buried channel may be formed by p-type epitaxial growth, which may provide a high channel mobility and/or a long carrier lifetime.

All of the implanted dopants may be activated by annealing the structure at a temperature of about 1600° C. with a silicon over pressure and/or covered by an encapsulation layer such as a graphite film. A high temperature anneal may damage the surface of the silicon carbide epitaxy. In order to reduce such damage, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 μm. The graphite coating may be heated to form a crystalline coating on the drift layer 14. The implanted ions may be activated by a thermal anneal that may be performed, for example, in an inert gas at a temperature of about 1600° C. or greater. In particular the thermal anneal may be performed at a temperature of about 1600° C. in argon for 5 minutes. The graphite coating may help to protect the surface of the drift layer 14 during the high temperature anneal.

The graphite coating may then be removed, for example, by ashing and thermal oxidation.

After implant annealing, a field oxide 30 of silicon dioxide having a thickness of about 1 μm is deposited and patterned to expose the active region of the device.

A gate oxide layer 34 may be formed by a gate oxidation process, with a final gate oxide thickness of 400-600 Å.

In particular, the gate oxide may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $Q_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/$SiO_2$ interface, which may introduce additional interface states. In particular, the wet $O_2$ anneal may be performed in wet $O_2$ at a temperature of about 950° C. for about 3 hours. The resulting gate oxide layer may have a thickness of about 500 Å.

After formation of the gate oxide 34, a polysilicon gate 32 may be deposited and doped, for example, with boron followed by a metallization process to reduce the gate resistance. Al/Ni contacts may be deposited as the p-type ohmic emitter contact metal 28, and Ni as the n-type collector contact metal 26. All contacts may be sintered in a Rapid Thermal Annealer (RTA), and thick Ti/Au layers may be used for pad metals.

The resistance of the JFET region may contribute to an undesirable increase in on-state forward voltage for the device 100. As described above, the resistance of the JFET region 24 may be reduced by ion implantation in the JFET region 24. However, ion implantation can cause crystal damage, which may reduce carrier lifetimes in JFET region 24. Furthermore, the implantation depth is limited by the maximum implantation energy, which may make it difficult to form an implanted JFET region that is deeper than the well regions 18 of the device 100.

Figure 2:
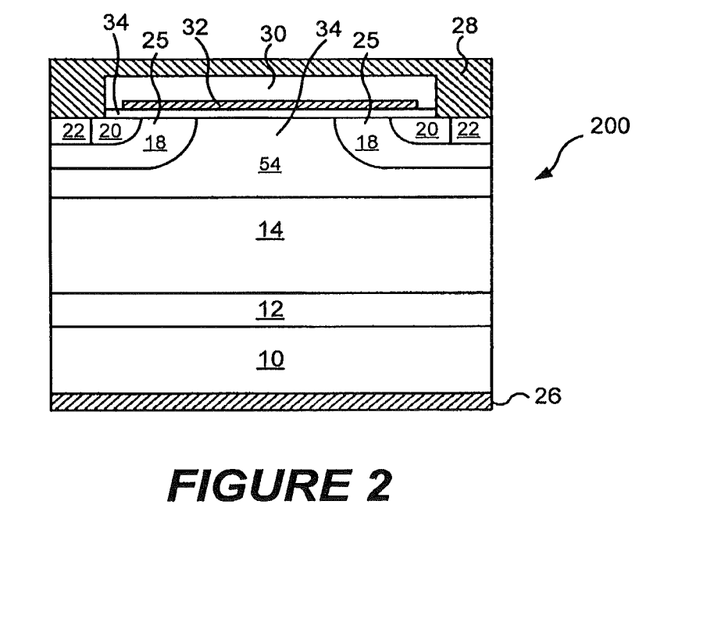
FIG. 2 is a cross-section of an IGBT device according to some embodiments of the invention.

Accordingly, some embodiments of the invention use epitaxial growth to form a current suppressing layer having a deep junction and having good crystal quality. The depth and doping concentration of current suppressing layer may be selected such that IGBT devices can achieve a low forward voltage drop/differential on-resistance and can maintain a high blocking capability FIG. 2 illustrates an IGBT device structure 200 according to some embodiments of the invention. In the IGBT structure 200, a p-type current suppressing layer 54 is epitaxially grown on the top of the drift layer 14. The current suppressing layer 54 may have a thickness and/or doping concentration that are selected to provide a desired tradeoff in device static and dynamic characteristics. For example, the current suppressing layer 54 may be designed such that the device 200 has a low forward voltage drop while maintaining a desired blocking capability.

The current suppressing layer 54 may have a doping concentration of about $1\times10^{15}$ to about $1\times10^{17}$ cm$^{-3}$, and in particular embodiments may be doped with aluminum at a concentration of about $1\times10^{16}$ cm$^{-3}$. Thus, the current suppressing layer 54 may provide a JFET region 34 adjacent the n+ wells 18 without ion implantation in the JFET region 34. The n+ wells 18, the p+ emitter regions 20 and the n+ contact regions 22 may be formed by implantation of ions into the current suppressing layer 54 using, for example, the implant conditions described above. In some embodiments, the current suppressing layer 54 may have a thickness of about 1 µm.

The presence of current suppressing layer 54 may result in benefits to the IGBT on-resistance. For example, the current suppressing layer 54 may suppress current conduction in the bipolar junction transistor (BJT) portion of the device that is formed by the n+ well regions 18, the p− drift layer 14 and the n+ substrate 10 by reducing current gain of NPN BJT, which may enhance hole accumulation underneath the MOS channel region 25. Thus, the carrier distribution of an IGBT device according to embodiments of the invention may approach that of an on-state PiN diode.

Additionally, a high doping concentration in the JFET region 34 may reduce the on-state resistance of the JFET region 34. Moreover, an epitaxially grown current suppressing layer 54 may exhibit a long carrier lifetime, which may reduce carrier recombination in the JFET region 34.

Figure 3:
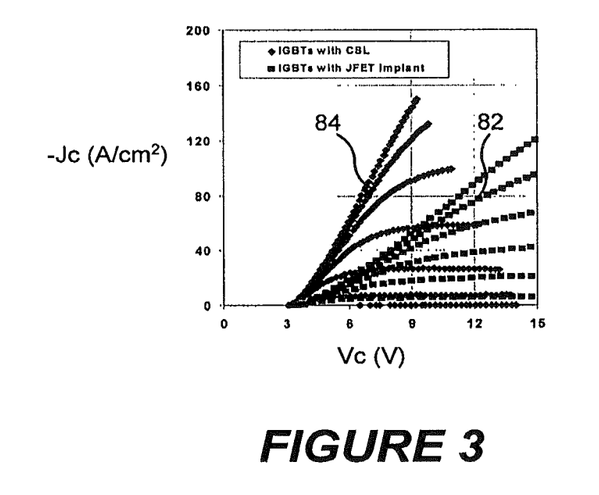
FIG. 3 is a graph of on-state J-V characteristics for an IGBT device according to some embodiments of the invention.

FIG. 3 is a graph of on-state J-V characteristics for an IGBT device according to some embodiments of the invention. In particular, FIG. 3 compares the forward J-V characteristics of IGBTs with implanted JFET regions and IGBTs having current suppressing layer structures at room temperature. Both devices were fabricated by the same process and designs except in the JFET region formation, as described above. In FIG. 3, the family of curves 82 represents the J-V curves for the IGBTs with implanted JFET regions, while the family of curves 84 represents the J-V curves for the IGBTs with current suppressing layers 54. The decrease in on-resistance for the IGBTs with current suppressing layers 54 is clearly evident in FIG. 3.

A forward voltage drop of 8.7V (differential on-resistance of 88 mΩ×cm$^2$) at a gate bias of 20 V was measured for the IGBTs with implanted JFET regions, while a forward voltage drop of 5.5V (differential on-resistance of 26 mΩ×cm$^2$) was measured for IGBTs with current suppressing layer structures at room temperature. This represents a significant reduction in forward voltage of approximately 37%.

Figure 4:
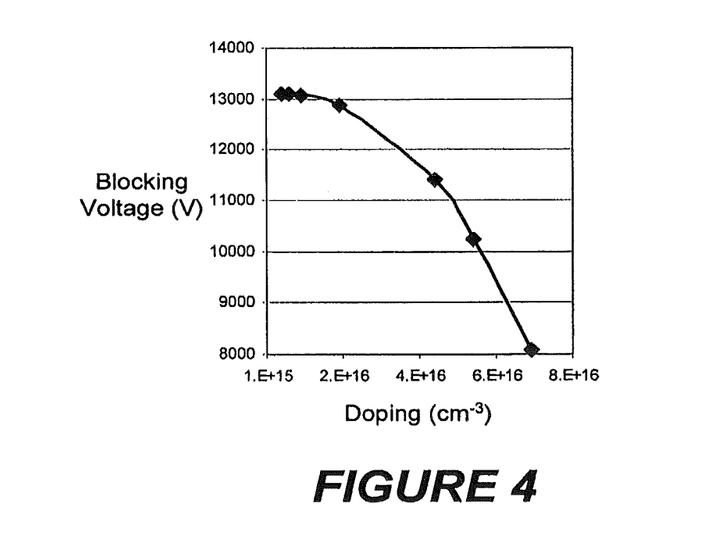
FIG. 4 is a graph of simulated blocking voltage versus current suppressing layer doping concentration for an IGBT device according to some embodiments of the invention.
Figure 5:
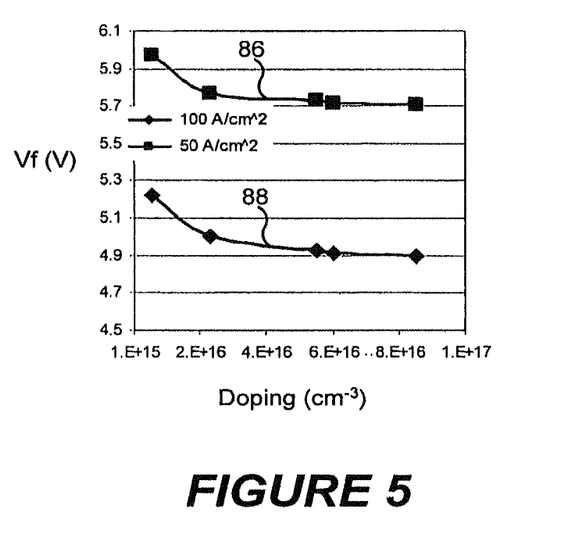
FIG. 5 is a graph of simulated forward voltage drop versus current suppressing layer doping concentration for an IGBT device according to some embodiments of the invention.

FIGS. 4 and 5 are graphs of simulated blocking voltage and forward voltage drop, respectively, versus current suppressing layer doping concentration for an IGBT device according to some embodiments of the invention. In the simulated device, the drift layer 14 had a thickness of 120 µm, while the current suppressing layer 54 had a thickness of 1 µm.

As shown in FIG. 4, the blocking voltage of an IGBT with a current suppressing layer 54 may remain high for doping concentrations of up to about $2\times10^{16}$ cm$^{-3}$, but may begin to drop off as the doping concentration is increased. As shown in FIG. 5, the forward voltage of an IGBT with a current suppressing layer 54 may decrease as the doping is increased from about $1\times10^{15}$ cm$^{-3}$ to about $2\times10^{16}$ cm$^{-3}$. After about $2\times10^{16}$ cm$^{-3}$, the reduction in forward voltage may tend to level off. Accordingly, as noted above, the doping of the current suppressing layer 54 may be chosen to provide an acceptably low on-state forward voltage while maintaining an acceptably high blocking voltage.

It will be appreciated that although some embodiments of the invention have been described in connection with silicon carbide IGBT devices having n-type substrates and p-type drift layers, and in which the minority carriers injected into the drift layer include electrons, the present invention is not limited thereto, and may be embodied in devices having p-type substrates and/or n-type drift layers.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a transistor, comprising:
   providing a substrate having a first conductivity type;
   forming a drift layer on the substrate, wherein the drift layer has a second conductivity type opposite the first conductivity type;
   forming a current suppressing layer on the drift layer, wherein the current suppressing layer has the second conductivity type and has a doping concentration that is larger than a doping concentration of the drift layer;
   forming a well region in the current suppressing layer, wherein the well region has the first conductivity type; and
   forming an emitter region in the well region, wherein the emitter region has the second conductivity type,
   wherein the current suppressing layer has a thickness and doping concentration that reduce current gain of a bipolar transistor portion of the transistor formed by the well region, the drift layer and the substrate, and thereby enhance carrier accumulation in a channel region of the transistor.

2. The method of claim 1, wherein forming the current suppressing layer comprises growing an epitaxial layer on the drift layer.

3. The method of claim 2, wherein the substrate comprises an off-axis n-type silicon carbide substrate, wherein forming the drift layer comprises forming a p-type silicon carbide epitaxial layer on the substrate, and wherein forming the current suppressing layer comprises forming a p-type silicon carbide epitaxial layer on the drift layer.

4. The method of claim 1, wherein the current suppressing layer has a thickness of about 1 µm.

5. The method of claim 1, wherein the current suppressing layer has a doping concentration of about $1\times10^{15}$ cm$^{-3}$ to about $1\times10^{17}$ cm$^{-3}$.

6. The method of claim 4, wherein the current suppressing layer has a doping concentration of about $1\times10^{16}$ cm$^{-3}$.

7. The method of claim 1, wherein forming the well region comprises forming the well region to have a junction depth that is less than a thickness of the current suppressing layer.

8. The method of claim 1,
wherein the current suppressing layer has a thickness of about 1 μm, and
wherein the well region has a junction depth of about 0.5 μm.

9. The method of claim 1, wherein the transistor comprises an insulated gate bipolar transistor.

10. A method of forming a transistor, comprising:
providing an n-type silicon carbide substrate;
forming a p-type silicon carbide drift layer on the n-type silicon carbide substrate;
forming a p-type epitaxial silicon carbide current suppressing layer on the p-type silicon carbide drift layer, the epitaxial current suppressing layer having a doping concentration that is larger than a doping concentration of the p-type silicon carbide drift layer;
forming a first n+ well region in the epitaxial current suppressing layer, wherein the first n+ well region has a junction depth that is less than a thickness of the epitaxial current suppressing layer; and
forming a p+ emitter region in the first n+ well region,
wherein the epitaxial current suppressing layer has a thickness and doping concentration that reduce current gain of a bipolar transistor portion of the transistor formed by the first n+ well region, the p-type silicon carbide drift layer and the n-type silicon carbide substrate, and thereby enhance hole accumulation in a channel region of the transistor.

11. The method of claim 10, further comprising:
forming a second n+ well region in the epitaxial current suppressing layer, wherein the second n+ well region has a junction depth that is less than a thickness of the epitaxial current suppressing layer, and wherein the first and second n+ well regions are separated by the current suppressing layer; and
forming a JFET region in between the first and second n+ well regions.

12. The method of claim 11, wherein p-type dopants in the JFET region are formed to have a doping concentration of about $1\times10^{16}$ cm$^{-3}$.

13. The method of claim 11, further comprising:
forming a buried channel region in the first n+ well region between the p+ emitter region and the JFET region.

14. The method of claim 13, wherein forming the buried channel region modifies a threshold voltage and/or an inversion channel mobility of the insulated gate bipolar transistor.

15. The method of claim 13, wherein forming the buried channel region comprises implanting p-type dopants into the first n+ well region.

16. The method of claim 10, wherein the transistor comprises an insulated gate bipolar transistor.

* * * * *

UNITED STATES PATENT AND TRADEMARK OFFICE
CERTIFICATE OF CORRECTION

| | | |
|---|---|---|
| PATENT NO. | : 9,064,840 B2 | Page 1 of 1 |
| APPLICATION NO. | : 14/465931 | |
| DATED | : June 23, 2015 | |
| INVENTOR(S) | : Zhang | |

It is certified that error appears in the above-identified patent and that said Letters Patent is hereby corrected as shown below:

In the Specification

Column 6, Line 33: Please correct "dry $Q_2$ oxide"
to read -- dry $O_2$ oxide --

Column 7, Line 64: Please correct "bias of 20 V was"
to read -- bias of -20 V was --

Signed and Sealed this
Twelfth Day of April, 2016

Michelle K. Lee
*Director of the United States Patent and Trademark Office*